United States Patent
Hara

(10) Patent No.: US 10,881,041 B2
(45) Date of Patent: Dec. 29, 2020

(54) COMPONENT MOUNTING MACHINE, FEEDER DEVICE, AND SPLICING WORK DEFECT DETERMINATION METHOD

(71) Applicant: FUJI CORPORATION, Chiryu (JP)

(72) Inventor: Akira Hara, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 293 days.

(21) Appl. No.: 15/751,647

(22) PCT Filed: Aug. 31, 2015

(86) PCT No.: PCT/JP2015/074762
§ 371 (c)(1),
(2) Date: Feb. 9, 2018

(87) PCT Pub. No.: WO2017/037846
PCT Pub. Date: Mar. 9, 2017

(65) Prior Publication Data
US 2018/0235120 A1 Aug. 16, 2018

(51) Int. Cl.
*H05K 13/08* (2006.01)
*H05K 13/04* (2006.01)
(Continued)

(52) U.S. Cl.
CPC .......... *H05K 13/08* (2013.01); *H05K 1/0269* (2013.01); *H05K 13/0215* (2018.08); *H05K 13/0417* (2013.01); *H05K 13/082* (2018.08)

(58) Field of Classification Search
CPC ............. H05K 13/021; H05K 13/0417; H05K 13/0452; H05K 13/0473; H05K 13/0478;
(Continued)

(56) References Cited

U.S. PATENT DOCUMENTS 9,580,264 B2 * 2/2017 Yamasaki .............. B65H 20/20
2007/0011869 A1 1/2007 Watanabe et al.
(Continued)

FOREIGN PATENT DOCUMENTS

EP   1 965 627 A2   9/2008
EP   2 273 864 A1   1/2011
(Continued)

OTHER PUBLICATIONS

Extended European Search Report dated Jul. 19, 2018 in European Patent Application No. 15902968.5, 8 pages.
(Continued)

*Primary Examiner* — Carl J Arbes
(74) *Attorney, Agent, or Firm* — Oblon, McClelland, Maier & Neustadt, L.L.P.

(57) ABSTRACT

A component mounting machine includes: a feeder device; a component transfer device; a splice portion detecting section detecting a splice portion further on a near side than a supply position of the feeder device; a passing determination section determining if the splice portion is in the passing state in which the splice portion is positioned within a passing area; a suction abnormality determination section determining the suction abnormality state in which a suction nozzle is not able to suck a component; a work defect determination section determining the splicing work defect when the suction abnormality state is determined and the splice portion is determined to be in the passing state; and an abnormality display section that performs dedicated abnormality display when the splicing work defect is determined.

4 Claims, 5 Drawing Sheets

(51) Int. Cl.
*H05K 13/02* (2006.01)
*H05K 1/02* (2006.01)

(58) Field of Classification Search
CPC .... H05K 13/08; H05K 13/086; H05K 13/082; H05K 1/0269; H65K 13/02; H65K 13/04; H65H 20/20
See application file for complete search history.

(56) References Cited

U.S. PATENT DOCUMENTS

| | | |
|---|---|---|
| 2008/0201940 A1 | 8/2008 | Watanabe et al. |
| 2009/0119912 A1 | 5/2009 | Watanabe et al. |
| 2015/0223373 A1* | 8/2015 | Yamasaki ............. H05K 13/02 226/76 |

FOREIGN PATENT DOCUMENTS

| | | | |
|---|---|---|---|
| JP | 2004-47572 | A | 2/2004 |
| JP | 2009-105464 | A | 5/2009 |
| JP | 4425836 | B2 * | 3/2010 |
| JP | 2010-87305 | A | 4/2010 |
| JP | 2010-129948 | A | 6/2010 |
| JP | 5063198 | B2 * | 10/2012 |
| JP | 2013-98360 | A | 5/2013 |
| JP | 2014-123636 | A | 7/2014 |
| WO | 2013 157107 | * | 10/2013 |
| WO | 2014102965 | A1 * | 7/2014 |
| WO | 2014103395 | A1 * | 7/2014 |
| WO | 2014167692 | * | 10/2014 |
| WO | 2015121929 | A1 * | 8/2015 |

OTHER PUBLICATIONS

International Search Report dated Dec. 1, 2015, in PCT/JP2015/074762 filed Aug. 31, 2015.

* cited by examiner

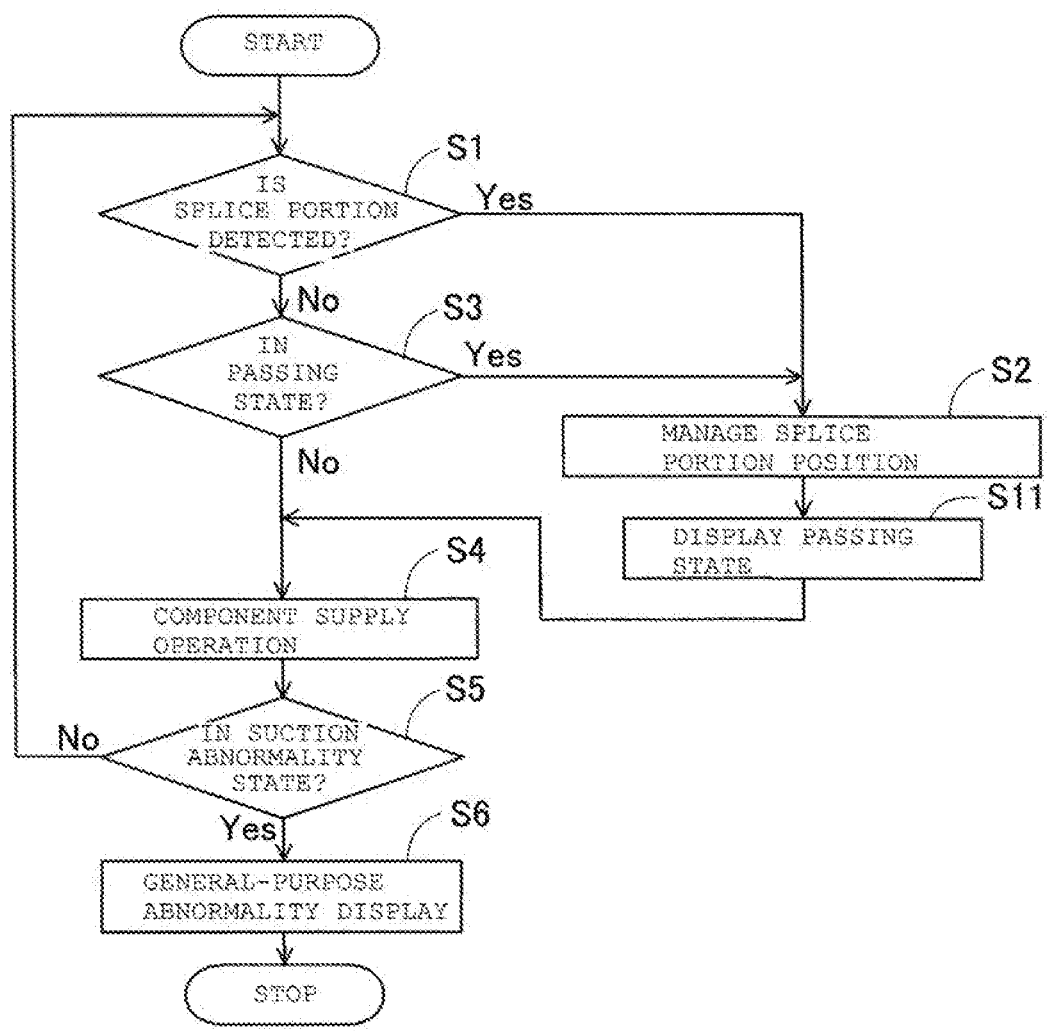

FIG.10

| LED COLOR | FUNCTION | LED STATE | | |
|---|---|---|---|---|
| | | LIT | FLASHING | UNLIT |
| GREEN | POWER DISPLAY | POWER ON | — | POWER OFF |
| ORANGE | SPLICE PORTION POSITION DISPLAY | PASSING STATE | — | NORMAL STATE |
| RED | ABNORMALITY DISPLAY | DEVICE ABNORMALITY | SUCTION ABNORMALITY STATE | NORMAL |

US 10,881,041 B2

COMPONENT MOUNTING MACHINE, FEEDER DEVICE, AND SPLICING WORK DEFECT DETERMINATION METHOD

TECHNICAL FIELD

The present invention relates to a component mounting machine and a feeder device, and in further detail, relates to determination of a defect in splicing work for connecting two carrier tapes that are used in the feeder device.

BACKGROUND ART

A solder printing machine, a component mounting machine, a reflow machine, a hoard inspection machine, and the like may be used as equipment for producing a hoard on which multiple components are mounted. Typically, a board production line is configured by connecting these sets of equipment to each other. Among these, the component mounting machine is provided with a board conveyance device, a component supply device, a component transfer device, and a control device. There is a feeder device for the method for feeding out the carrier tape on which cavity sections that hold components lined up in one row as a representative example of the component supply device. When a first carrier tape that is used by the feeder device approaches a tail end, an operator performs splicing work for connecting a second carrier tape using splice tape. A technical example which relates to this type of feeder device is disclosed in PTL 1 and PTL 2.

The component supply feeder of PTL 1 has means for electrically connecting with an external device, means for storing information that is obtained by the electrical connection, and means for displaying the stored information. Mounting positional information of the component supply feeder that is mounted to the component mounting apparatus or information about a supplied electronic component is indicated as information that is stored and displayed. Thereby, concerning various errors such as a recognition error in which there is no component on the supply position or a suction error in which the component is not sucked by a suction nozzle, it is possible to explicitly recognize error content.

In addition, an electronic component mounting device of PTL 2 is provided with means for detecting a mistake in taking out a component by a takeout tool (suction nozzle), means tor detecting a characteristic part of a storage tape (carrier tape), and means for determining passage of a connecting tape (splice tape) that connects old and new storage tapes based on the detection result of the characteristic part. Thereby, it is possible to conveniently detect a join part that is connected by the connecting tape. Giving supplemental explanation, ordinarily, several cavity sections that are positioned in front and at the rear of the splice tape do not hold an electronic component, and a component takeout mistake is inevitably generated in the cavity section. Then, in the technique of PTL 2, it is determined that the connecting tape has passed, while detecting the component takeout mistake. Thereby, no abnormality is determined even if the component takeout mistake is generated, and a skip operation of the storage tape is also possible.

CITATION LIST

Patent Literature

PTL 1: JP-A-2004-47572
PTL 2: JP-A-2014-123636

SUMMARY OF INVENTION

Technical Problem

Note that, typically multiple feeder devices are equipped in a component counting machine in order to mount many types of components on a board, and multiple feeder devices are further used in a component mounting line that consists of multiple component mounting machines. Therefore, the operator needs to frequently perform splicing work, and is required to accurately perform splicing work in a short time. When splicing work is not accurate, as a result of splice tape peeling or getting caught, a tape feeding defect is generated, and production of a board is interrupted due to the generation of a suction mistake.

The suction mistake is generated for various reasons in another splicing work defect. Even if a state after production is interrupted by the suction mistake is investigated, in many cases the splice tape is already discharged, and it is not easy to specify a cause. If it is assumed that it is possible to specify that the cause of the suction mistake is a splicing work defect, investigation and implementation of recurrence prevention measures, technological improvement of operators, or the like are efficiently performed, and productivity is finally improved. However, the technologies of PTL 1 and PTL 2 do not determine a splicing work defect.

The present invention is made in consideration of the problems of the background art, and a problem to be solved is to provide a component mounting machine that is able to determine whether or not the cause of occurrence of a suction abnormality state in which a component is not able to be sucked is the cause of the splicing work defect, a feeder device, and a splicing work defect determination method.

Solution to Problem

The present invention to solve the problems described above provides a component mounting machine including: a feeder device that feeds out a carrier tape that is formed with cavity sections, that hold components, lined up in a row and sequentially supplies the components to a predetermined supply position; a component transfer device that has a suction nozzle that sucks the component from the cavity section of the supply position and mounts the component on a board, a mounting head that holds the suction nozzle, and head driving mechanisms that drive the suction nozzle and the mounting head; a splice portion detecting section that is provided at a detection position further on a near side than the supply position of the feeder device and detects the splice portion that connects a tail end of a first carrier tape and a leading end of a second carrier tape with each other; a passing determination section that determines whether or not the splice portion is in a passing state in which, when a position at which the splice portion is fed out from the detection position by a predetermined length longer than a separation distance between the detection position and the supply position is referred to as a discharge position, the splice portion is positioned within a passing area from the detection position to the discharge position; a suction abnormality determination section that determines a suction abnormality state in which the suction nozzle is not able to suck the component from the cavity section of the supply position; a work defect determination section that determines a splicing work defect in a case where the suction abnormality state is determined and the splice portion is determined to be in the passing state; and an abnormality display section that performs dedicated abnormality display in a case where the splicing work defect is determined.

There is provided a feeder device of the present invention that is equipped in a component mounting machine, feeds out a carrier tape that is formed with cavity sections, that hold components lined up in one row, and sequentially supplies the components to a predetermined supply position, the device provided with: a splice portion detecting section that is provided at a detection position further on a near side than the supply position and detects the splice portion that connects a tail end of a first carrier tape and a leading end of a second carrier tape with each other; a passing determination section that determines whether or not the splice portion is in a passing state in which a position at which, when the splice portion is fed out from the detection position by a predetermined length longer than a separation distance between the detection position and the supply position is referred to as a discharge position, the splice portion is positioned within a passing area from the detection position to the discharge position; a work defect determination section that determines a splicing work defect in a case where a suction abnormality state is determined in which the component; mounting machine is not able to suck the component from the cavity section at the supply position and the splice portion is determined to be in the passing state; and an abnormality display section that performs dedicated abnormality display in a case where the splicing work defect is determined.

The present invention provides a splicing work defect determination method that is a method for determining a defect of splicing work in which a tail end of a first carrier tape and a leading end of a second carrier tape are connected with each other, in a component mounting machine provided with a feeder device that feeds out a carrier tape that is formed with cavity sections that hold components lined up in one row and sequentially supplies the components to a predetermined supply position, and a component transfer device that has a suction nozzle that sucks the component from the cavity section of the supply position and mounts the component on a board, a mounting head that holds the suction nozzle, and head driving mechanisms that drive the suction nozzle and the mounting head, the method comprising: a splice portion detection step of detecting the splice portion at a detection position further on a near side than the supply position of the feeder device; a passing determination step of determining whether or not the splice portion is in a passing state in which, when a position at which the splice portion is fed out from the detection position by a predetermined length longer than a separation distance between the detection position and the supply position is referred to as a discharge position, the splice portion is positioned within a passing area from the detection position to the discharge position; a suction abnormality determination step of determining a suction abnormality state in which a suction nozzle is not able to suck the component from the cavity section of the supply position; a work defect determination step of determining a splicing work defect in a case where the suction abnormality state is determined and the splice portion is determined to be in the passing state; and an abnormality display step of performing dedicated abnormality display in a case where the splicing work defect is determined.

Advantageous Effects of Invention

In a component mounting machine of the present invention, a splicing work defect is determined and dedicated abnormality display is performed in a case where a suction abnormality state is determined in which it is not possible for the suction nozzle to suck a component and a splice portion is determined to be in a passing state. Accordingly, when the suction abnormality state occurs, an operator is able to determine whether or not the cause of the suction abnormality state is caused by the splicing work defect by confirming whether or not an abnormality display section performs dedicated abnormality display.

In addition, since the feeder device of the present invention is provided with substantially the same configuration requirements as the component mounting machine of the present invention described above, the same effects as the component mounting machine of the present invention occur.

Furthermore, since the splicing work defect determination method of the present invention is a method for replacing a function of configuration requirements of the component mounting machine of the present invention in respective implementation steps, the same effects as the component mounting machine of the present invention occur.

BRIEF DESCRIPTION OF DRAWINGS

FIG. 8 is a table that indicates display content of an abnormality display section of the operation panel.

FIG. 9 is a diagram of a process flow of a control section that explains operation of a feeder device of a second embodiment.

FIG. 10 is a table that indicates display content of an abnormality display section in the second embodiment.

DESCRIPTION OF EMBODIMENTS (1. Entire Configuration of Component Mounting Machine 1 of the Embodiments)

Figure 1:
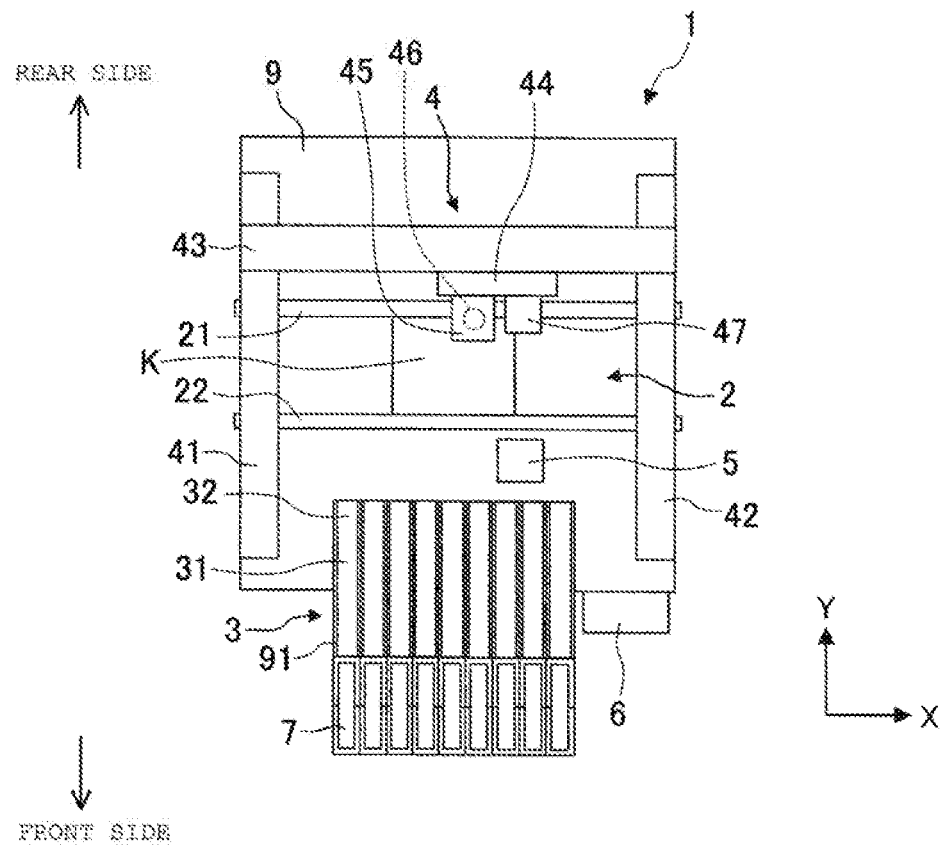
FIG. 1 is a planar view illustrating an entire configuration of a component mounting machine of an embodiment.

An entire configuration of a component mounting machine 1 of an embodiment of the present invention will be described with reference to FIG. 1. FIG. 1 is a planar view illustrating an entire configuration of a component mounting machine 1 of an embodiment. A direction from a paper surface left side toward the right side in FIG. 1 is an X-axis direction along which a board K is carried in and out, and a direction from the front on the paper surface lower side toward the rear of the paper surface upper side is a Y-axis direction. The component mounting machine 1 is configured by assembling a board conveyance device 2, multiple feeder devices 3, a component transfer device 4, a component camera 5, a control device 6, and the like on a device table 9. The board conveyance device 2, each feeder devices 3, the component transfer device 4, and the component camera 5 are controlled by the control device 6, and respectively carry out predetermined work.

The board conveyance device 2 carries in the board K to a mounting execution position, and positions and carries out the board K. The board conveyance device 2 consists of a pair of guide rails 21, 22, a pair of conveyor belts, a backup device, and the like. The multiple feeder devices 3 supply each of the components sequentially. The multiple feeder devices 3 are equipped lined up on a pallet table 91 on the upper face of the device table 3. Each feeder device 3 holds a tape reel 7 on the front side of a main body section 31 and sets the supply position 32 on the upper portion near the rear side of the main body section 31. The feeder device 3 is equivalent to the feeder device of the first embodiment of the present invention, and the detailed description thereof will be described later.

The component transfer device 4 sucks and collects components from each component supply position 32 of the multiple feeder devices 3, and the components are conveyed up to the positioned board K and mounted. The component transfer device 4 is a device of an XY-robot type that is horizontally movable in the X-axis direction and the Y-axis direction. The component transfer device 4 is constituted by a pair of Y-axis rails 41 and 42 and a Y-axis slider 43 that constitute a head driving mechanism, a mounting head 44 that is driven in the X-axis direction and the Y-axis direction, a nozzle tool 45, a suction nozzle 46, a board camera 47, and the like. The nozzle tool 45 has a suction nozzle 46 that sticks the component and is mounted on the board K while being replaceably held in the mounting head 44. The board camera 47 is provided in the mounting head 44 and images a positional fiducial mark that is attached to the board K and accurately detects the position of the board K.

The component camera 5 is provided with an upward orientation on an upper face of the device table 9 between the board conveyance device 2 and the feeder device 3. The component camera 5 images the state of the components that are sucked by the suction nozzle 46 while the mounting head 44 is moved from the feeder device 3 on the board K. The control device 6 is assembled on the device table 9 and the installation position of the control device 6 is not particularly limited. The control device 6 controls the component mounting operation according to a mounting sequence that is held advance.

(2. Detailed Configuration of Feeder Device 3 of First Embodiment)

Figure 2:
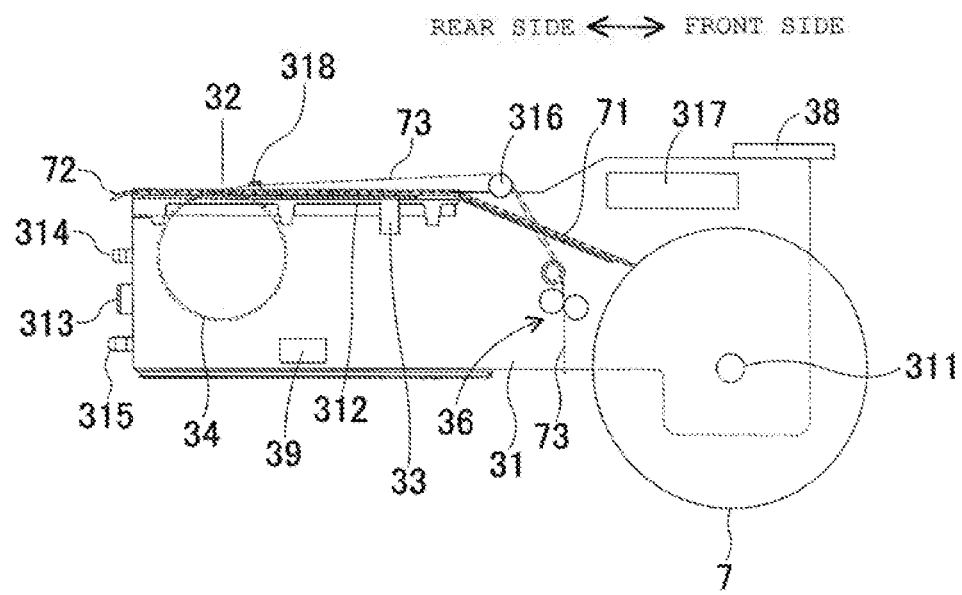
FIG. 2 is a side view of a feeder device of a first embodiment that is equipped in the component mounting machine of the embodiment.
Figure 3:
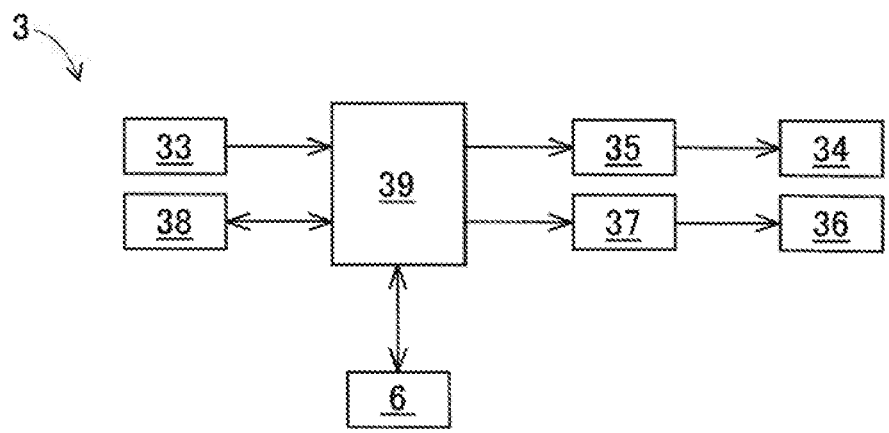
FIG. 3 is a block diagram illustrating a configuration for control of the feeder device of the first embodiment.

Next, the detailed configuration of the feeder device 3 will be described. FIG. 2 is a side view of a feeder device 3 of a first embodiment that is equipped in the component mounting machine 1 of the embodiment. In addition, FIG. 3 is a block diagram illustrating a configuration for control of the feeder device 3 of the first embodiment. The feeder device 3 is configured by the main body section 31, a splice tape detection sensor 33, a feeding sprocket 34, a discharge roller 36, an operation panel 38, a control section 39, and the like.

A reel supporting section 311 that is provided near to the lower portion on the front side of the main body section 31 rotatably and attachably and detachably supports the tape reel 7. The tape reel 7 winds and holds a carrier tape 71. A tape guide member 312 that guides the carrier tape 71 that is pulled out from the tape reel 7 is disposed approximately horizontally near the upper portion of the main body section 31. The splice tape detection sensor 33 is provided near the front side of the tape guide member 312. The supply position 32 is set near the rear side of the tape guide member 312.

Figure 4:
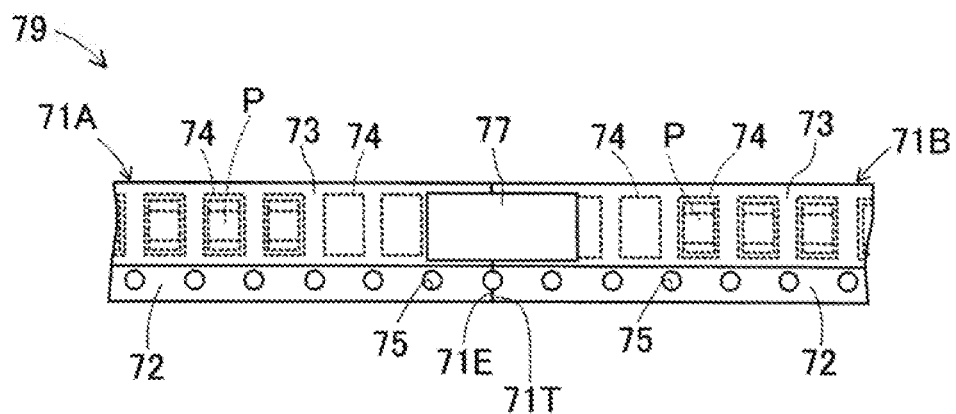
FIG. 4 is a top view of a splice portion that connects two carrier tapes.
Figure 5:
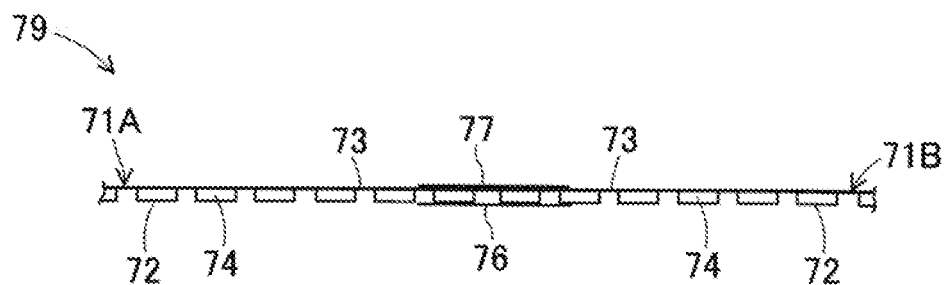
FIG. 5 is a side view of the splice portion.

FIG. 4 is a top view of a splice portion 79 that connects two carrier tapes 71 (71A, 71B). In addition, FIG. 5 is a side view of the splice portion 79. Each carrier tape 71 consists of a bottom tape 72 and a cover tape 73. The bottom tape 72 is made of paper or resin and cavity sections 74 that hold a component P are formed lined up in one row. Furthermore, sprocket holes 75 are formed lined up in one row along one side edge of the bottom tape 72. The cover tape 73 is made of a thin film, and is bonded to the bottom tape 72 by two adhesive portions. The cover tape 73 covers the cavity sections 74 to prevent drop out of the component P, and does not cover the sprocket holes 75.

When the component P of the first carrier tape 71A that is used the feeder device 3 becomes small, an operator performs splicing work for connecting the second carrier tape 71B that holds components P of the same type. First, the operator trims a tail end 71E of the first carrier tape 71A and the leading end 71T of the second carrier tape 71B and causes the tail end 71E and the leading end 71T to abut with each other. Next, the operator bonds a bottom side splice tape 76 so as to straddle the bottom tape 72 of both carrier tapes 71A and 71B. In the same manner, the operator bonds a cover side splice tape 77 so as to straddle the cover tape 73 of both carrier tapes 71A and 71B. The bottom side splice tape 76 and the cover side splice tape 77 do not cover the sprocket holes 75.

A predetermined number of cavity sections 74 counted from the tail end 71E of the first carrier tape 71A do not hold the components P. In the same manner, a predetermined number of cavity sections 74 counted from the leading end 71T of the second carrier tape 71B do not hold the components P. In FIGS. 4 and 5, a case in indicated of a case where the predetermined number of tail ends 71E and leading ends 71T is three. Not limited thereto, the predetermined number is modifiable, or the predetermined number of tail ends 71E and leading ends 71T may be different. The predetermined number of tail ends 71E and leading ends 71T are input and set and stored in the control section 39.

In addition, at least the bottom side splice tape 76 is configured by an adhesive tape that contains metal. The splice tape detection sensor 33 detects the bottom side splice tape 76 that contains metal. It is possible to exemplify a sensor for a method for detecting capacitance between target objects as the splice tape detection sensor 33. The exemplified splice tape detection sensor 33 determines that the splice portion 79 is passing when the detected capacitance is large. The splice tape detection sensor 33 is one embodiment of the splice portion detecting section of the present invention that is provided at a detection position further to the near side than the supply position 32.

Returning to FIG. 2, a communication connector 313 is provided at an approximately intermediate height on the rear face of the main body section 31. The communication connector 313 communicates and connects the control section 39 and the control device 6 by fitting in a communication connector on the pallet table 91 side. Furthermore, the operation power of the feeder device 3 is supplied via the communication connector 313. Respective positioning pins 314 and 315 are provided at positions on the top and the bottom to interpose the communication connector 313 on the rear face of the main body section 31. The positioning pins 314 and 315 fit in a positioning hole on the pallet table 91 side and determine an equipment position of the feeder device 3 with respect to the pallet table 91.

A feeding sprocket 34 is supported on the lower side of the supply position 32 of the main body section 31. Teeth of the feeding sprocket 34 protrude slightly upward from a hole that is bored in the tape guide member 312 and fit into a sprocket hole 75 of the carrier tape 71. The feeding sprocket 34 feeds out the carrier tape 71 at a pitch feed when intermittently driven to restate by a feeding motor 35.

Thereby, the carrier tape 71 is fed out to the supply position 32 from the tape reel 7 through the tape guide member 312. The cover tape 73 is peeled off from the bottom tape 72 and folded back at the peeling position 318 in front of the supply position 32 and is returned to the front side. The bottom tape 72 that is opened by the cavity section 74 supplies the component P to the suction nozzle 46 at the supply position 32. The bottom tape 72 is discharged to the rear side of the feeder device 3 after the component P is supplied.

A direction change roller 316 is disposed at a position further on the front side than the tape guide member 312 on the upper portion of the main body section 31. Furthermore, a pair of discharge rollers 36 that interpose the cover tape 73 are provided at a position further on the lower side and front side than the direction change roller 316. The pair of discharge rollers 36 are supported on the main body section 31, and are driven to rotate by a discharge motor 37. The cover tape 73 that returns from the near side of the supply position 32 changes direction obliquely to the front and down by the direction change roller 316 and is discharged downward by a pair of discharge rollers 36.

Figure 6:
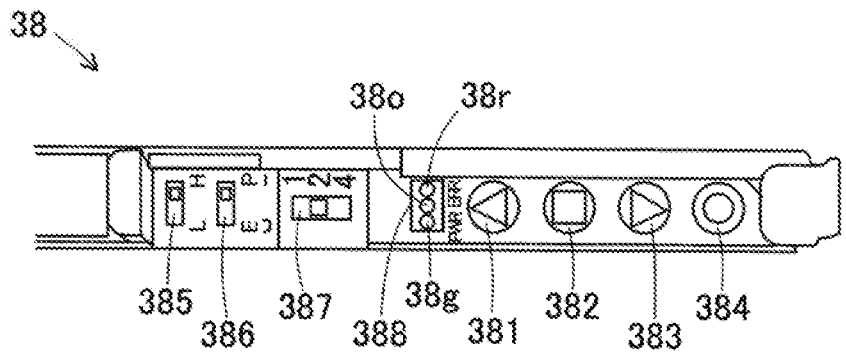
FIG. 6 is a top view of an operation panel of the feeder device.

The operation panel 38 is disposed further on the front side than the front end of a handle 317 on the upper portion of the main body section 31. FIG. 6 is a top view of an operation panel 38 of the feeder device 3. The operation panel 38 has four push buttons 381 to 384, three selector switches 385 to 387, and an abnormality display section 388. The feeding motor 35 is driven forward by pressing down the first push button 381, and the carrier tape 71 is fed out. An error in the feeding amount of the carrier tape 71 is eliminated by performing origin alignment of the rotational position of the feeding sprocket 34 by pressing down the second push button 382. In addition, the feeding motor 35 is driven in reverse by pressing down the third push button 383, and the carrier tape 71 is pulled back. The discharge motor 37 is driven by pressing down the fourth push button 384, and slack of the cover tape 73 is wound.

The first selector switch 383 is a switch that switches between high and low feeding speed of the carrier tape 71. The second selector switch 386 is a switch that sets the type of the carrier tape 71 to either of an embossed tape or a paper tape. The third selector switch 387 is a switch that selectively sets the feeding pitch of the carrier tape 71, that is, a disposition pitch of the cavity section 74 from out of 1 mm, 2 mm, and 4 mm.

The abnormality display section 388 consists of three colors of LED (indicator lamp). A green LED 33g, an orange LED 38o, and a red LED 38r is able to take on a lit state, a flashing state, and an unlit state that are independent of each other. The abnormality display section 388 is able to be configured by unitized inexpensive general-purpose products. The detailed abnormality display function of the abnormality display section 388 will be described.

The control section 39 is disposed on the main body section 31 and the installation position is not particularly limited. The control section 39 is a computer device that has a CPU and is operated by software, and controls operation of the feeder device 3. As shown in FIG. 3, the control section 39 receives a detection signal of the splice tape detection sensor 33 and exchanges information with the operation panel 38. Furthermore, the control section 39 controls the operation of the feeding motor 35 and the discharge motor 37. In addition, as described above, when the feeder device 3 is equipped on the pallet table 91, the control section 33 communicates and connects with the control device 6. The control section 39 has a function of the passing determination section and the work defect determination section of the present invention.

In this arrangement, when the splicing work is defective, the splice portion 79 that is indicated in FIGS. 4 and 5 is not formed correctly. In a defective splice portion 79, a tape feeding defect tends to occur as a result of peeling or catching of the splice tapes 76 and 77. The feeding defect tends to occur while discharging the cover side splice tape 77 using the discharge roller 36 after passing the splice tape detection sensor 33 (detection position). That is, the cover side splice tape 77 may be caught in a neck position such as the peeling position 318, the direction change roller 316, the discharge roller 36, and the like.

Meanwhile, the feeding defect tends to occur while feeding out the bottom side splice tape 76 to the feeding sprocket 34 after passing the splice tape detection sensor 33 until reaching the rear end of the feeder device 3. Comparing the two splice tapes 76 and 77, the distance at which the feeding defect tends to occur is longer than the cover side splice tape 77. Accordingly, it is possible to set the discharge roller 36 that is the neck position furthest to the rear of the cover side splice tape 77 to the discharge position of the present invention.

According to this setting, the movement distance of the cover side splice tape 77 that reaches the discharge roller 36 (discharge position) is a predetermined length through the peeling position 318 and the direction change roller 316 from the splice tape detection sensor 33 (detection position). In addition, the interval from the splice tape detection sensor 33 up to the discharge roller 36 is the passing area of the present invention. Information about a predetermined length and information about a separation distance between the splice tape detection sensor 33 (detection position) and the supply position 32 is held in advance in the control section 39.

(3. Operation of Component Mounting Machine 1 of Embodiment and Feeder Device 3 of First Embodiment)

Figure 7:
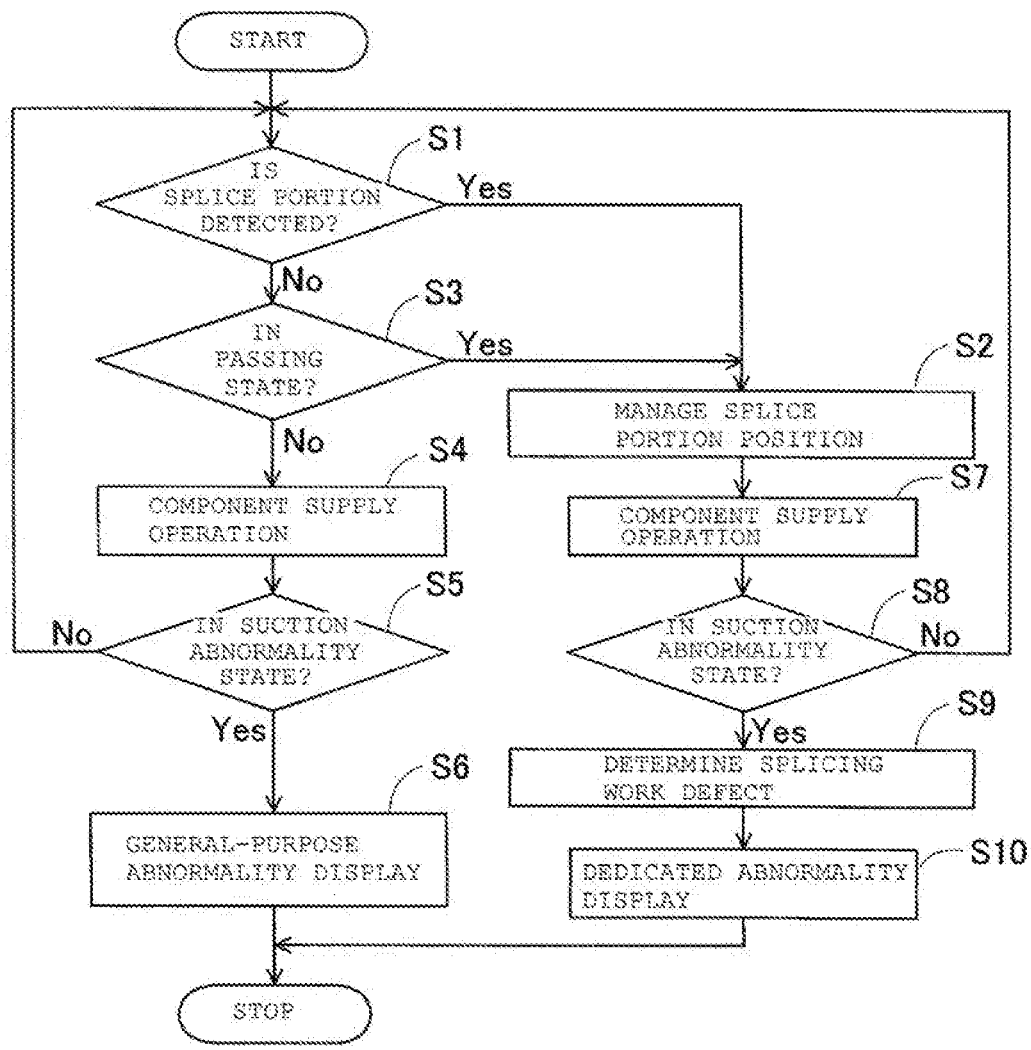
FIG. 7 is a diagram of a process flow that explains operation of the component mounting machine of the embodiment.

Next, the operation of the component mounting machine 1 of the embodiment will be described. FIG. 7 is a diagram of a process flow that explains operation of the component mounting machine 1 of the embodiment. Note that, since the process flow is substantially advanced by the control section 39 of the feeder device 3, FIG. 7 is a diagram that describes an operation of the feeder device 3 of the first embodiment. In step S1 in FIG. 7, the control section 39 discriminates whether or not the splice tape detection sensor 33 detects the splice portion 79. When the splice portion 79 is detected, the control section 39 advances the execution of the process flow to step S2. In addition, in step S3 when the splice portion 79 is not detected, the control section 39 discriminates whether or not the splice portion 79 is in the passing state positioned in the passing area. When in the passing state, the control section 39 advances the execution of the process flow to step S2.

In step S2, the control section 39 manages the position of the splice portion 79. There are two specific sets of process content in step S2. In the first process content, the control section 39 manages the number of remaining components that remain in the first carrier tape 71A. In other words, the control section 39 manages a state in which the splice portion 79 is fed out from the splice tape detection sensor 33 up to the supply position 32. Thereby, the control section 39 is able to control (skip control) such that the splice portion, 79 and the cavity section 74, which does not hold the components P in front and to the rear of the splice portion 79, pass the supply position 32. Accordingly, when there is no last component P of the first carrier tape 71A, insignificant suction operations are omitted, and the first component P of the second carrier tape 71B is supplied to the supply position 32 in a short time.

In the second process content, the control section 39 determines whether or not the splice portion 79 is in the passing state. That is, it is determined whether or not the splice portion 79 is fed out from the splice tape detection sensor 33 by a predetermined length. The second process content of step S2 and the process content of step S3 is equivalent to the passing determination section of the present invention.

When the splice portion 79 is not detected, and is not in the passing state, the control section 39 advances the execution of the process flow to step S4 and performs the component supply operation. The component supply is an operation in a normal state in which the splice portion 79 is not involved. In the subsequent step S5, the control section 39 determines the suction abnormality state.

The suction abnormality state signifies that a suction mistake occurs in which the suction nozzle 46 is not able to suck the component P from the cavity section 74 of the supply position 32. The occurrence of the suction mistake is able to be determined by imaging the suction nozzle 46 from below by the component camera 5 or is able to be determined by imaging the suction nozzle 46 from the side by a camera device that is provided on the mounting head 44. There are various variations in the definition of the suction abnormality state. For example, there may be a suction abnormality state with only one suction mistake, and there may be the suction abnormality state when the suction mistake is not eliminated even if the suction operation is repeated a predetermined number of times with respect to the cavity section 74 at one location. Furthermore, in a case where the suction mistake is continued at the cavity section 74 at a predetermined number of locations, the suction abnormality state is also possible. The suction abnormality state is determined by the component transfer device 4, and the determination result is transmitted from the control device 6 to the control section 39. The process content of step S5 is equivalent to the suction abnormality determination section of the present invention.

When the suction abnormality stats does not occur in step S5, the control section 39 returns implementation of the process flow to step S1, and transitions to the supply of the subsequent component P. When the suction abnormality state occurs in step S5, the control section 39 advances implementation of the process flow to step S6. In step S6, the control section 39 commands general-purpose abnormality display (described in detail later) that represents the "suction abnormality state" to the operation panel 38, and stops thereafter.

After the position of the splice portion 79 is managed in step S2, the control section 39 advances the execution of the process flow to step S7, and performs component supply operation. The component supply is an operation when the splice portion 79 is in the passing state. In the subsequent step S8, the control section 39 determines the suction abnormality state in the same manner as in step S5. The process content of step S8 is equivalent to the suction abnormality determination section of the present invention.

When the suction abnormality state does not occur in step S8, the control section 39 returns implementation of the process flow to step S1, and transitions to the supply of the subsequent component P. When the suction abnormality state occurs in step S8, the control section 39 advances implementation of the process flow to step S9, and determines that the cause of the suction abnormality state is caused by the splicing work defect. The process content of step S9 is equivalent to the work defect determination section of the present invention. In the subsequent step S10, the control section 39 commands dedicated abnormality display (described in detail later) that represents the "suction abnormality state in the passing state of the splice portion 79" to the operation panel 38, and stops thereafter.

Next, the display content of the abnormality display section 38B of the operation panel 38 is described together with the related art. FIG. 8 is a table that indicates display content of the abnormality display section 38B of the operation panel 38. In FIG. 8, a column in which horizontal lines are filled in signifies non-use. The flashing state of the orange LED 38o in the drawings is not used in the related art, and is display content that is added in the embodiment.

In the related art, the green LED 38g of the abnormality display section 38B functions as a power display, and the orange LED 38o is in non-use. In addition, the red LED 38r functions as the abnormality display, and the operator is required to investigate and cope. In detail, lighting of the green LED 38g represents "power on", and unlit represents "power off". Lighting of the red LED 38r represents "device abnormality" of the feeder device 3, flashing represents "suction abnormality state", and unlit represents "normal". The "suction abnormality state" is a state in which it is unknown whether or not the cause location is inside the feeder device 3, and therefore is displayed differently from the "device abnormality".

Furthermore, in the embodiment, flashing of the orange LED 38o is newly used as a dedicated abnormality display. Plashing of the orange LED 38o represents the splice portion is in the passing state when the "suction abnormality state" occurs that is represented by flashing of; the red LED 38r. Accordingly, flashing of the orange LED 38o is displayed together with the flashing of the red LED 38r, and is not displayed alone.

Flashing of the red LED 38r in the related art is performed as a general-purpose abnormality display that represents the "suction abnormality state" in step S6 of the process flow in FIG. 7. In addition, flashing of the red LED 38r and flashing of the orange LED 38o are performed together as a dedicated abnormality display that represents the "suction abnormality state" in step S10.

(4. Modes and Effects of Component Mounting Machine 1 of Embodiment and Feeder Device 3 of First Embodiment)

The component mounting machine 1 of the embodiment is provided with: a feeder device 3 that feeds out the carrier tape 71 (71A, 71B) that is formed with cavity sections 74 that hold components P lined up in a row and sequentially supplies the components P to the predetermined supply position 32; the component transfer device 4 that has the suction nozzle 46 that sucks the component P from the cavity section 74 of the supply position 32 and mounts the Component P on a hoard K, the mounting head 44 that holds the suction nozzle 46, and the head driving mechanisms (41-43) that drive the suction nozzle 46 and the mounting head 44; the splice tape detection sensor 33 (splice portion detecting section) that is provided at the detection position further on the near side than the supply position 32 of the feeder device 3 and detects the splice portion 79 that connects the tail end 71E of the first carrier tape 71A and the leading end 71T of the second carrier tape 71B with each other; the passing determination section (step S2, step S3)

that determines whether or not the splice portion 79 is in the passing state in which the position at which the splice portion 79 is fed out from the detection position by a longer predetermined length than the distance between the detection position and the supply position 32 is referred to as a discharge position (discharge roller 36) and the splice portion 79 is positioned within the passing area from the detection position to the discharge position; the suction abnormality determination section (step S5, step S8) that determines the suction abnormality state in which the suction nozzle 46 is not able to suck the component P from the cavity section 74 of the supply position 32; the work defect determination section (step S9) that determines the splicing work defect in a case where the suction abnormality state is determined and the splice portion 79 is determined to be in the passing state; and the abnormality display section 388 that performs dedicated abnormality display in a case where the splicing work defect is determined.

Thereby, the splicing work defect is determined and dedicated abnormality display is performed by flashing of an orange LED 38o in a case where the suction abnormality state is determined in which it is not possible for the suction nozzle 46 to suck the component P and the splice portion 79 is determined to be in the passing state. Accordingly, when the suction abnormality state occurs, an operator is able to determine whether or not the cause of the suction abnormality state is caused by the splicing work defect by confirming whether or not the abnormality display section 388 performs dedicated abnormality display.

Furthermore, the abnormality display section 388 performs general-purpose abnormality display by flashing of the red LED 38r in a case where the suction abnormality state is determined and the splice portion 79 is determined to not be in the passing state, and performs flashing (general-purpose abnormality display) of the red LED 38r together with flashing (dedicated abnormality display) of the orange LED 38o in a case where the splicing work defect is determined.

Thereby, since the abnormality display section 388 requires only a minor change from the conventional configuration, an increase in costs is suppressed. For example, the abnormality display function of the abnormality display section 388 that consists of three colors of LED (indicator lamps) that are described in the embodiment is able to realize only a device for control by firmware without adding hardware.

The feeder device 3 of the first embodiment is equipped in the component mounting machine 1 and feeds out a carrier tape 71 (71A, 71B) that is formed with cavity sections 74 that hold components P lined up in a row and sequentially supplies the components P to the predetermined supply position 32, the feeder device 3 provided with: the splice tape detection sensor 33 (splice portion detecting section) that is provided at a detection position further on a near side than the supply position 32 and detects the splice portion 79 that connects the tail end 71E of the first carrier tape 71A and the leading end 71T of the second carrier tape 71B with each other; a passing determination section (step S2, step S3) that determines whether or not the splice portion 79 is in the passing state in which, when the position at which the splice portion 79 is fed out from the detection position by a predetermined length longer than a separation distance between the detection position, the supply position 32 is referred to as a discharge position (discharge roller 36) and the splice portion 79 is positioned within the passing area from the detection position to the discharge position; a work defect determination section (step S9) that determines a splicing work defect in a case where the suction abnormality state is determined in which the component mounting machine 1 is not able to suck the component P from the cavity section 74 at the supply position 32 and the splice portion 79 is determined: to be in the passing state; and an abnormality display section 388 that performs dedicated abnormality display in a case where the splicing work defect is determined.

Thereby, since the feeder device 3 of the first embodiment is provided with substantially the same configuration requirements as the component mounting machine 1 of the embodiment, the same effects as the component mounting machine 1 of the embodiment occur.

Note that, the component mounting machine 1 of the embodiment is also able to be carried out as a splicing work defect determination method by replacing the functions of the component mounting machine 1 in an implementation step. That is, a function in which the splice portion 79 is detected by the splice tape detection sensor 33 is replaced in the splice portion detection step. In addition, the function of the passing determination section is replaced in a passing determination step, the function of the suction abnormality determination section is replaced in ah suction abnormality determination step, and the function of the work defect determination section is replaced in a work defect determination step. Furthermore, the function in which the abnormality display section 388 performs dedicated abnormality display is replaced in the abnormality display step.

In the splicing work defect determination method of the embodiment that consists of each step described above, the same effects occur in the component mounting machine 1 of the embodiment.

(5. Feeder Device of Second Embodiment)

Next, concerning the feeder device of the second embodiment, the different functions and operations from the first embodiment are mainly described. The feeder device of the second embodiment is the same as the feeder device 3 of the first embodiment with regard to the hardware configuration, and the function of the control section 39 and the display content of the abnormality display section 388 are different. FIG. 9 is a diagram of a process flow of a control section 39 that explains operation of a feeder device of the second embodiment. In the process flow of the second embodiment, the process content of step S1 to step S6 are the same as the first embodiment. In step S11 after step S2 in FIG. 9, the control section 39 commands display of the splice portion 79 in the passing state on the operation panel 38, and implementation of the subsequent process flow advances to step S4.

FIG. 10 is a table that indicates display content of the abnormality display section 388 in the second embodiment. As exemplified, instead of the flashing state of the orange LED 38o in the first embodiment, in the second embodiment, the lighting of the orange LED 38o represents the "passing state" of the splice portion 79, and turning off represents the "normal state" in which the splice portion 79 is not involved. Unrelated to the abnormality display content of the red LED 38r, the orange LED 38o switches from being lit and unlit dependent on only the position of the splice portion 79.

In the second embodiment, when the red LED 38r is flashing, the operator is able to determine whether or not the "suction abnormality state" is caused by the splicing work defect by referring to whether or not the orange LED 38o is lit. In addition, unrelated to the display of the red LED 38r, the operator is able to ascertain whether or not the splice portion 79 is in the passing state.

The feeder device of the second embodiment is equipped in the component mounting machine 1 and feeds out the carrier tape 71 that is formed with cavity sections 74 that hold components P lined up) in a row and sequentially supplies the components P to a predetermined supply position 72, the feeder device provided with: a splice tape detection sensor 33 (splice portion detecting section) that is provided at a detection position further on a near side than the supply position 72 and detects the splice portion 79 that connects the tail end 71E of the first carrier tape 71A and the leading end 71T of the second carrier tape 71B with each other; a passing determination section (step S2, step S3) that determines whether or not the splice portion 79 is in a passing state in which, when the position at which the splice portion 79 is fed out from the detection position by a predetermined length longer than a separation distance between the detection position and the supply position 32 is referred to as a discharge position (discharge roller 36), the splice portion 79 is positioned within the passing area from the detection position to the discharge position; and the orange LED 38o (passing display section) of the abnormality display section 388 that displays that the splice portion 79 is in the passing state.

Thereby, when the suction abnormality state occurs in which the suction nozzle 46 does not suck the component P, the operator is able to determine whether or not the cause of the suction abnormality state is caused by the splicing work defect by referring to whether or not the orange LED 38o is lit.

(6. Applications and Modifications of Embodiment)

Note that, as the splice portion detecting section, instead of the splice tape detection sensor 33, it is possible to use a tape imaging camera. The tape imaging camera detects the splice tapes 76 and 77 by image processing the acquired image data by imaging the carrier tape 71. In addition, in each embodiment, the abnormality display section 388 may be provided in a location other than the feeder device 3, for example, the display section of the control device 6. The configuration of the abnormality display section 388 and the method of the abnormality display are able to be variously modified. Furthermore, the present invention is able to be implemented in the feeder device with a structure in which only one side of the two adhesive sections of the cover tape 73 is peeled and the cavity section 74 is open, and the cover tape 73 and the bottom tape 72 are integrally discharged without any changes. Various other applications and modifications of the present invention are possible.

REFERENCE SIGNS LIST

1: component mounting machine, 2: board conveyance device, 3: feeder device, 31: main body section, 33: splice tape detection sensor, 34: feeding sprocket, 36: discharge roller, 38: operation panel, 388: abnormality display section, 38g: green LED, 38o: orange LED, 38r: red LED, 39: control section, 4: component transfer device, 46: suction nozzle, 5: component camera, 6: control device, 7: tape reel, 71, 71a, 71b: carrier tape, 72: bottom tape, 73: cover tape, 74: cavity section, 76: bottom side splice tape, 77: cover side splice tape, 79: splice portion

The invention claimed is:

1. A feeder device that is equipped in a component mounting machine, feeds out a carrier tape that is formed with cavity sections, that hold components, lined up in one row, and sequentially supplies the components to a predetermined supply position, the device comprising:

a splice portion detecting sensor that is provided at a detection position further on a near side than the supply position and detects the splice portion that connects a tail end of a first carrier tape and a leading end of a second carrier tape with each other;
a controller configured to
  determine whether or not the splice portion is in a passing state in which, the splice portion is positioned within a passing area from the detection position to a discharge position; and
  determine a suction abnormality state in which the suction nozzle is not able to suck the component from the cavity section of the supply position based on imaging the suction nozzle with an imaging device; and
a display that displays a first display state when the splice portion is in the passing state, and displays a second display state when the suction abnormality state is determined and the splice portion is determined not to be in the passing state, the first display state being different from the second display state.

2. A feeder device that is equipped in a component mounting machine, feeds out a carrier tape that is formed with cavity sections, that hold components, lined up in one row, and sequentially supplies the components to a predetermined supply position, the device comprising:

a splice portion detecting sensor that is provided at a detection position further on a near side than the supply position and detects the splice portion that connects a tail end of a first carrier tape and a leading end of a second carrier tape with each other;
a controller configured to
  determine whether or not the splice portion is in a passing state in which the splice portion is positioned within a passing area from the detection position to a discharge position; and
  determine a splicing work defect when a suction abnormality state is determined in which the component mounting machine is not able to suck the component from the cavity section at the supply position based on imaging the suction nozzle with an imaging device, and the splice portion is determined to be in the passing state; and
an abnormality display that displays a first display state when the splicing work defect is determined, and displays a second display state when the suction abnormality state is determined and the splice portion is determined not to be in the passing state, the first display state being different from the second display state.

3. A component mounting machine comprising:

a feeder device that feeds out a carrier tape that is formed with cavity sections, that hold components, lined up in one row and sequentially supplies the components to a predetermined supply position;
a component transfer device including a suction nozzle that sucks the component from the cavity section of the supply position and mounts the component on a board, a mounting head that holds the suction nozzle, and head driving mechanisms that drive the suction nozzle and the mounting head;
a splice portion detecting sensor that is provided at a detection position further on a near side than the supply position of the feeder device and detects the splice portion that connects a tail end of a first carrier tape and a leading end of a second carrier tape with each other;

a controller configured to
  determine whether or not the splice portion is in a passing state in which the splice portion is positioned within a passing area from the detection position to a discharge position;
  determine a suction abnormality state in which the suction nozzle is not able to suck the component from the cavity section of the supply position based on imaging the suction nozzle with an imaging device; and
  determine a splicing work defect when the suction abnormality state is determined and the splice portion is determined to be in the passing state; and
an abnormality display that displays a first display state when the splicing work defect is determined, and displays a second display state when the suction abnormality state is determined and the splice portion is determined not to be in the passing state, the first display state being different from the second display state.

4. A splicing work defect determination method for determining a defect of splicing work in which a tail end of a first carrier tape and a leading end of a second carrier tape are connected with each other, in a component mounting machine provided with a feeder device that feeds out a carrier tape that is formed with cavity sections that hold components lined up in one row and sequentially supplies the components to a predetermined supply position, and a component transfer device that has a suction nozzle that sucks the component from the cavity section of the supply position and mounts the component on a board, a mounting head that holds the suction nozzle, and head driving mechanisms that drive the suction nozzle and the mounting head, the method comprising:
  detecting the splice portion at a detection position ftirther on a near side than the supply position of the feeder device;
  determining whether or not the splice portion is in a passing state in which the splice portion is positioned within a passing area from the detection position to a discharge position;
  determining a suction abnormality state in which the suction nozzle is not able to suck the component from the cavity section of the supply position based on imaging the suction nozzle with an imaging device;
  determining a splicing work defect when the suction abnormality state is determined and the splice portion is determined to be in the passing state;
  displaying a first display state when the splicing work defect is determined; and
  displaying a second display state when the suction abnormality state is determined and the splice portion is determined not to be in the passing state, the second display state being different from the first display state.

* * * * *